(12) United States Patent
Smith et al.

(10) Patent No.: US 8,518,162 B2
(45) Date of Patent: Aug. 27, 2013

(54) METHOD OF TREATING A GAS STREAM

(75) Inventors: James Robert Smith, Taunton (GB);
Andrew James Seeley, Bristol (GB);
Derek Martin Baker, Bristol (GB);
Marilena Radoiu, Bristol (GB)

(73) Assignee: Edwards Limited, West Sussex (GB)

( * ) Notice: Subject to any disclaimer, the term of this patent is extended or adjusted under 35 U.S.C. 154(b) by 782 days.

(21) Appl. No.: 11/990,255

(22) PCT Filed: Jul. 27, 2006

(86) PCT No.: PCT/GB2006/002795
§ 371 (c)(1),
(2), (4) Date: Apr. 29, 2009

(87) PCT Pub. No.: WO2007/020374
PCT Pub. Date: Feb. 22, 2007

(65) Prior Publication Data
US 2011/0197759 A1 Aug. 18, 2011

(30) Foreign Application Priority Data

Aug. 15, 2005 (GB) .................................. 0516695.4
Oct. 27, 2005 (GB) .................................. 0521961.3

(51) Int. Cl.
*B01D 53/00* (2006.01)
(52) U.S. Cl.
USPC ............. 95/288; 422/173; 423/240 R; 588/31
(58) Field of Classification Search
USPC ................... 95/4, 57, 60, 67, 73, 288; 96/15, 96/74; 422/168, 173, 186.04, 186.21, 186.22; 204/157.3; 423/240 R; 588/311, 415, 406
See application file for complete search history.

(56) References Cited

U.S. PATENT DOCUMENTS

| 6,045,618 A * | 4/2000 | Raoux et al. .................. 118/715 |
| 2004/0144489 A1 | 7/2004 | Satoh et al. |
| 2005/0145173 A1 * | 7/2005 | Holber et al. ............. 118/723 E |

FOREIGN PATENT DOCUMENTS

| EP | 1 093 849 A1 | 4/2001 |
| EP | 1 270 763 A1 | 1/2003 |
| EP | 1 297 891 A1 | 4/2003 |
| GB | 2273027 A | 6/1994 |
| JP | EP-1093849 A1 * | 4/2001 |
| JP | 2004216231 A | 8/2004 |

OTHER PUBLICATIONS

United Kingdom Search Report of Application No. GB 0521961.3; Date of mailing: Jan. 26, 2006; Claims searched: 1-28; Date of Search: Jan. 24, 2006.

(Continued)

*Primary Examiner* — Robert A Hopkins
(74) *Attorney, Agent, or Firm* — Westman, Champlin & Kelly, P.A.

(57) ABSTRACT

A method is described for treating gas exhaust from a polysilicon etch process, which uses a plasma abatement device to treat the gas. The device comprises a stainless steel gas chamber having a gas inlet for receiving the gas and a gas outlet. As the gas may contain a halocompound and water vapor, the chamber is heated to a temperature that inhibits adsorption of water on the surface within the chamber, thereby inhibiting corrosion of the gas chamber. The gas is then conveyed to the gas chamber for treatment, and the temperature of the chamber is maintained above said temperature during treatment of the gas.

12 Claims, 6 Drawing Sheets

(56) References Cited

OTHER PUBLICATIONS

PCT Notification of Transmittal of the International Search Report and the Written Opinion of the International Searching Authority, or the Declaration of International Application No. PCT/GB2006/002795; Date of mailing: Oct. 23, 2006.

PCT International Search Report of International Application No. PCT/GB2006/002795; Date of mailing of the International Search Report: Oct. 23, 2006.

PCT Written Opinion of the International Searching Authority of International Application No. PCT/GB2006/002795; Date of mailing: Oct. 23, 2006.

Prosecution history of corresponding Chinese Application No. 200680029637.7 including: First Office Action dated Jun. 26, 2009; Response dated Jan. 11, 2010; Second Office Action dated May 20, 2010; Response dated Sep. 28, 2010; Office Action dated Jan. 27, 2011; Response dated Feb. 25, 2011 and Grand Notice dated Apr. 26, 2011.

Prosecution history of corresponding Japanese Application No. 2008526530 including: First Office Action dated Dec. 6, 2010; Second Office Action dated Apr. 25, 2011; Response filed Sep. 26, 2011 and Grant Details.

Prosecution history of corresponding Korean Application No. 20087003634 including: Office Action Jun. 11, 2012; Response dated Aug. 8, 2012 and Final Office Action dated 2012.

* cited by examiner

METHOD OF TREATING A GAS STREAM

FIELD OF THE INVENTION

The present invention relates to a method of treating a gas stream using a plasma abatement device. The invention is particularly suitable to the treatment of a gas stream exhaust from a polysilicon etch process.

BACKGROUND OF THE INVENTION

During the formation of a semiconductor or flat panel display device, various different process gases are supplied to various process chambers. Chemical vapour deposition (CVD) is used to deposit thin films or layers on the surface of a substrate or wafer located in a deposition chamber. This process operates by supplying one or more reactive gases to the chamber, often using a carrier gas, to the substrate's surface under conditions that encourage chemical reactions to take place at the surface. For example, TEOS and one of oxygen and ozone may be supplied to the deposition chamber for the formation of a silicon oxide layer on the substrate, and silane and ammonia may be supplied for the formation of a silicon nitride layer. Polycrystalline silicon, or polysilicon, is deposited on the substrate by the decomposition of silane or a chlorosilane by heat.

Gases are also supplied to an etch chamber to perform selective etching of areas of the deposited layers, for example during the formation of electrodes and the source and drain regions of a semiconductor device. Etching gases can include the perfluorocompounds such as $CF_4$, $CHF_3$ and $NF_3$, other halocompounds such as HCl, HBr, $BCl_3$, $Cl_2$ and $Br_2$, and combinations thereof. For example, $CF_4$ is commonly used to initially form an opening in a region of a nitride or oxide layer formed over a polysilicon layer and which is exposed by a photoresist layer, and a mixture of HBr and $Cl_2$ is commonly used to subsequently etch the exposed polysilicon.

The etching gases can react with a photoresist to form deposits and tars that need to be periodically removed from the etch chamber, and so a cleaning gas, typically comprising $SF_6$ and oxygen, is periodically supplied to the etch chamber to remove the unwanted material from the chamber.

During these etch and cleaning processes performed within the etch chamber, there is typically a residual amount of the gas supplied to the etch chamber contained in the gas exhaust from the etch chamber. Perfluorocompounds such as $CF_4$ and $SF_6$ are highly dangerous if exhausted to the atmosphere, and so in view of this, before the exhaust gas is vented to the atmosphere, an abatement device is often provided to treat the exhaust gas. The abatement device converts the more hazardous components of the exhaust gas into species that can be readily removed from the exhaust gas, for example by conventional scrubbing, and/or can be safely exhausted to the atmosphere.

Perfluorocompounds (PFCs) such as $CF_4$, $SF_6$, $NF_3$ and $C_2F_6$ can be removed from the gas stream with high efficiency using a microwave plasma abatement device. An example of a microwave plasma reactor is described in UK Patent no. GB 2,273,027. In that device, a waveguide conveys microwave radiation from a microwave generator into a gas chamber housing two electrodes in a closely opposed relationship. A gas to be treated flows into the gas chamber through a gas inlet, and passes between the electrodes, so that a microwave plasma is initiated and sustained between the two electrodes from the gas flowing between the electrodes. One of the electrodes has an axial hole to provide a gas outlet from the gas chamber. Under the intensive conditions within the plasma, species within the gas stream are subjected to impact with energetic electrons causing dissociation into reactive species that can combine with oxygen or hydrogen to produce relatively stable by-products.

A convenient source of oxygen and hydrogen for reacting with the various species contained in the gas stream is water vapour, which may be readily added to the gas stream upstream from the abatement device. For example, reaction of $CF_4$ with water vapour will form $CO_2$ and HF, and $Cl_2$ can form HCl within the chamber. HF, HCl and HBr can be subsequently removed from the gas stream by a wet scrubber located downstream from the abatement device.

Various parts of a plasma abatement device, such as one or more of the electrodes, electrode holders and the inner surface of the chamber, are typically formed from stainless steel. In addition to iron, carbon, and chromium, stainless steel may also contain other elements, such as nickel, molybdenum, niobium and titanium. In the presence of air, a passive surface oxide layer is formed, which protects the underlying stainless steel from corrosion. However, in the presence of acidic gases such as HF, HCl, and HBr, the passive layer can be stripped, exposing the underlying stainless steel. For example, HF may be present in the gas chamber as a by-product of the treatment of a perfluorocompound within the gas chamber, and HCl or HBr may be contained in the gas exhaust from the process chamber during an etching process.

Once the nickel oxide layer has been removed, HBr, and HCl can react with the metals contained in the stainless steel when moisture levels are in excess of a few parts per million (ppm). Due to the water adsorbed on the stainless steel surface, the by-products of these reactions can degrade the gas chamber and the electrodes, which can reduce the efficiency of the abatement device.

It is an aim of at least the preferred embodiment of the present invention to provide an improved method of treating a gas stream containing varying amounts of a halocompound, such as HBr, HCl, $Br_2$ and $Cl_2$, and water vapour using a plasma abatement device.

SUMMARY OF THE INVENTION

In a first aspect, the present invention provides a method of treating a gas containing varying amounts of a halocompound and water vapour, the method comprising the steps of providing a plasma abatement device comprising a gas chamber having a gas inlet for receiving the gas and a gas outlet, heating the chamber to a temperature that inhibits adsorption of water on a stainless steel surface within the chamber, conveying the gas to the gas chamber for treatment thereof within the chamber, and maintaining the chamber at or above said temperature during treatment of the gas.

BRIEF DESCRIPTION OF THE DRAWINGS

Preferred features of the present invention will now be described, by way of example only, with reference to the accompanying drawings, in which.

DETAILED DESCRIPTION OF THE INVENTION

With reference to FIGS. 1 to 4, a microwave plasma abatement device 10 comprises an electrically conductive housing 12. The housing 12 is preferably formed from stainless steel. This may be an austenitic stainless steel, such as 304, 304L, 316, 316L, or other non-magnetic grade. As illustrated, the housing 12 may have a rectangular cross-section. A slot 14 is formed in the housing 12, for example by machining, and extends across the width of the housing 12 to provide a resonant cavity of the abatement device 10. One end of the resonant cavity 14 is connected to a waveguide 16 for conveying microwave radiation from a microwave generator (not shown) into the resonant cavity 14. The other end of the resonant cavity 14 is connected to a short circuit 18.

The waveguide 16 comprises a first, substantially rectangular body portion 20 having a height $h_1$ substantially parallel to the $TE_{01}$ electric field of the microwave radiation conveyed through the waveguide 16 to the resonant cavity 14, and a width w orthogonal to the electric field of the microwave radiation. The waveguide 16 also comprises a second, substantially rectangular body portion 22 facing the resonant cavity 14, the second body portion 22 having a height $h_2$ and a width w, where $h_2 < h_1$. In the illustrated example, the second body portion 22 has a height of approximately one third of the height of the first body portion 20.

The waveguide 16 further comprises a tapered, convergent portion 24 of width w located between the first and second body portions 20, 22. The tapered portion 24 comprises a first end surface 25a adjacent the first body portion 20 of height $h_1$ and width w, and a second end surface 25b adjacent the second body portion 22 of height $h_2$ and width w. The tapered portion 24 further comprises first and second side surfaces 25c, 25d extending between the end surfaces 25a, 25b and inclined at an acute angle to the second side surface 25b such that the first and second body portions 20, 22 are co-axial. The tapered portion 24 has a length/in the direction of propagation of the microwave radiation through the waveguide 16, where/ is equal to approximately one half of the wavelength of the microwave radiation.

The short circuit 18 provides an extension of the waveguide 16 on the opposite side of the resonant cavity 14. The short circuit 18 comprises a chamber 27 defined in part by an end plate 26 that is distanced from the end of the second portion 22 of the waveguide 16 such that the incident microwave radiation is reflected by the end plate 26 to form an electromagnetic standing wave within the resonant cavity 14. The position of the end plate 26 relative to the end of the second portion 22 of the waveguide 16 may be adjustable.

The short circuit 18 comprises a tuner 29 spaced from the end plate 26 for tuning the short circuit 18. In the illustrated example, the tuner comprises a screw 29 threaded into the top surface of the short circuit 18 such that the body of the screw extends into the chamber 27 substantially perpendicular to the direction of propagation of the microwave radiation through the chamber 27. By turning the head 29a of the screw 29, the end of the screw 29 can be raised or lowered within the chamber 27 to tune the short circuit 18.

The resonant cavity 14 houses two dielectric plate members 28, 30, preferably formed from PTFE or other suitable material for retaining adequate corrosion resistance whilst being substantially transparent to the microwave radiation conveyed through the resonant cavity 14. Each plate member 28, 30 has a flat sidewall portion 32 extending orthogonally to the direction of propagation of the microwave radiation through the resonant cavity 14, and a curved sidewall portion 34 which define in part a substantially cylindrical gas chamber 36 within the resonant cavity 14. The gas chamber 36 may have a circular or elliptical cross-section.

Each plate member 30, 32 has a first bore 38 formed therein providing a gas inlet into the gas chamber 36 of the resonant cavity 14. In the illustrated abatement device 10, one of the bores 38 is aligned with a gas inlet port 40 formed in a sidewall of the housing 12 for receiving gas from a first gas conduit 42 mounted on the housing 12. A second gas port may optionally be formed in the opposite sidewall of the housing 12 for receiving gas from a second gas conduit, which gas may be the same as, or dissimilar to, the gas entering the gas chamber 36 from the first gas conduit 42. Each gas inlet is preferably configured so that gas enters the gas chamber 36 from the first gas conduit 40 substantially tangentially, so that the gas swirls inwardly within the gas chamber 36 towards the centre of the gas chamber 36. A gas outlet port 44 is formed in the base of the housing 12 for conveying gas from the gas chamber 36 to a second gas conduit 46. The gas outlet port 44 extends transversely of, and is preferably co-axial with, the gas chamber 36.

Each plate member 30, 32 also has a smaller second bore 48 formed therein. One of the bores 48 is aligned with an aperture 50 formed in a sidewall of the housing and closed by a transparent cover plate 52 to provide an inspection window for enabling a user to observe a plasma generated within the gas chamber 36 of the resonant cavity 14 during use of the abatement device 10.

A cylindrical bore 54 is also formed in the housing 12, the bore 54 extending transversely of the resonant cavity 14 and defining with the resonant cavity a gas chamber of the abatement device 10. The bore 54 is preferably substantially co-axial with the gas chamber 36 and gas outlet port 44. The bore 54, receives an electrically conducting assembly 56. The assembly 56 comprises an electrically conducting member 58 and a holder 60 for holding the electrically conducting member 58.

Figure 5:
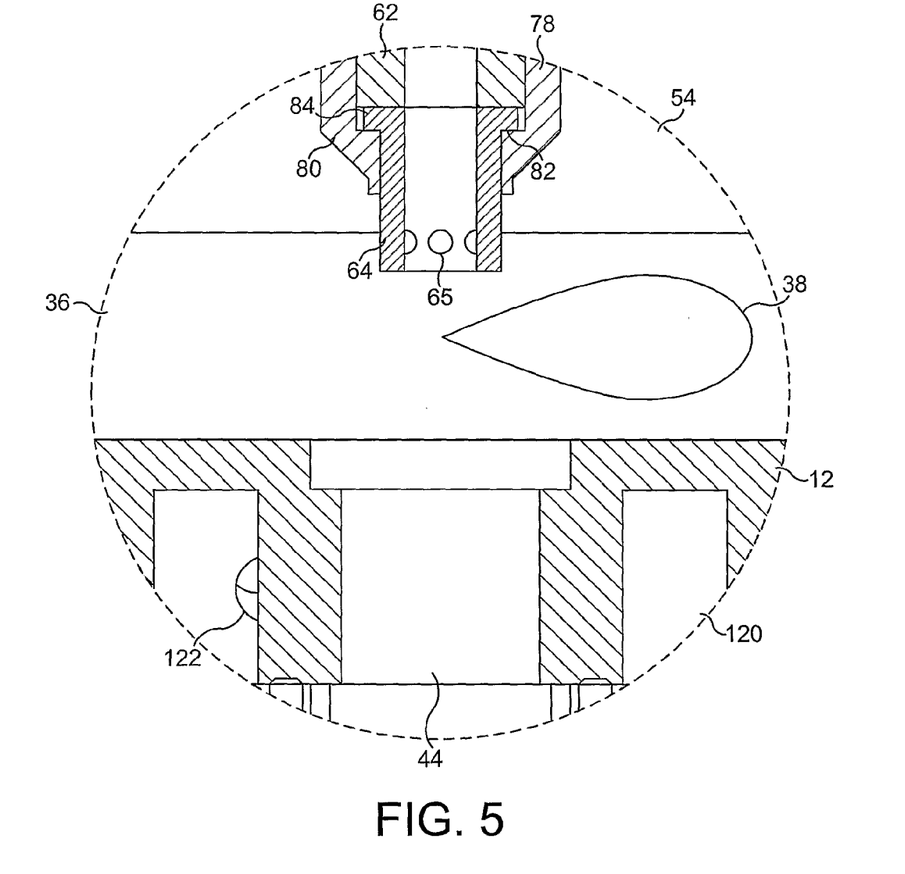
FIG. 5 is an enlarged view of region C identified in FIG. 3.

The electrically conducting member 58 comprises an elongate tube 62, which may be formed from copper or other electrically conducting material, and which engages a tubular tip 64, as illustrated in more detail in FIG. 5. The tip 64 is preferably formed from corrosion and heat resistant material, such as tungsten or a tungsten alloy, for example an alloy of tungsten and lanthanum. The tip 64 may be provided with a plurality of apertures 65 extending thereabout to enable a gas flowing between the gas inlet 38 and the gas outlet 44 to pass radially through the tip 64 and thereby enhance the cooling of the tip 64. The apertures 65 are preferably dimensioned so that microwave radiation passes through the apertures 65.

Figure 3:
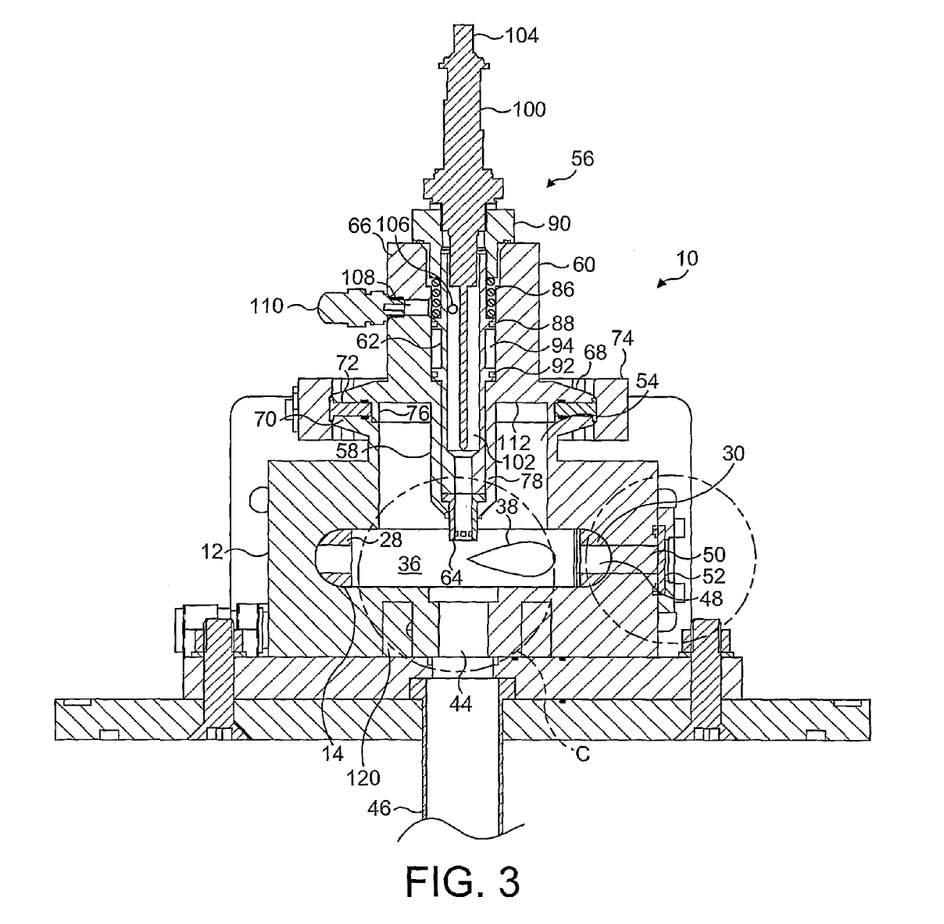
FIG. 3 is a cross-sectional view through the device along line A-A of FIG. 2.
Figure 4:
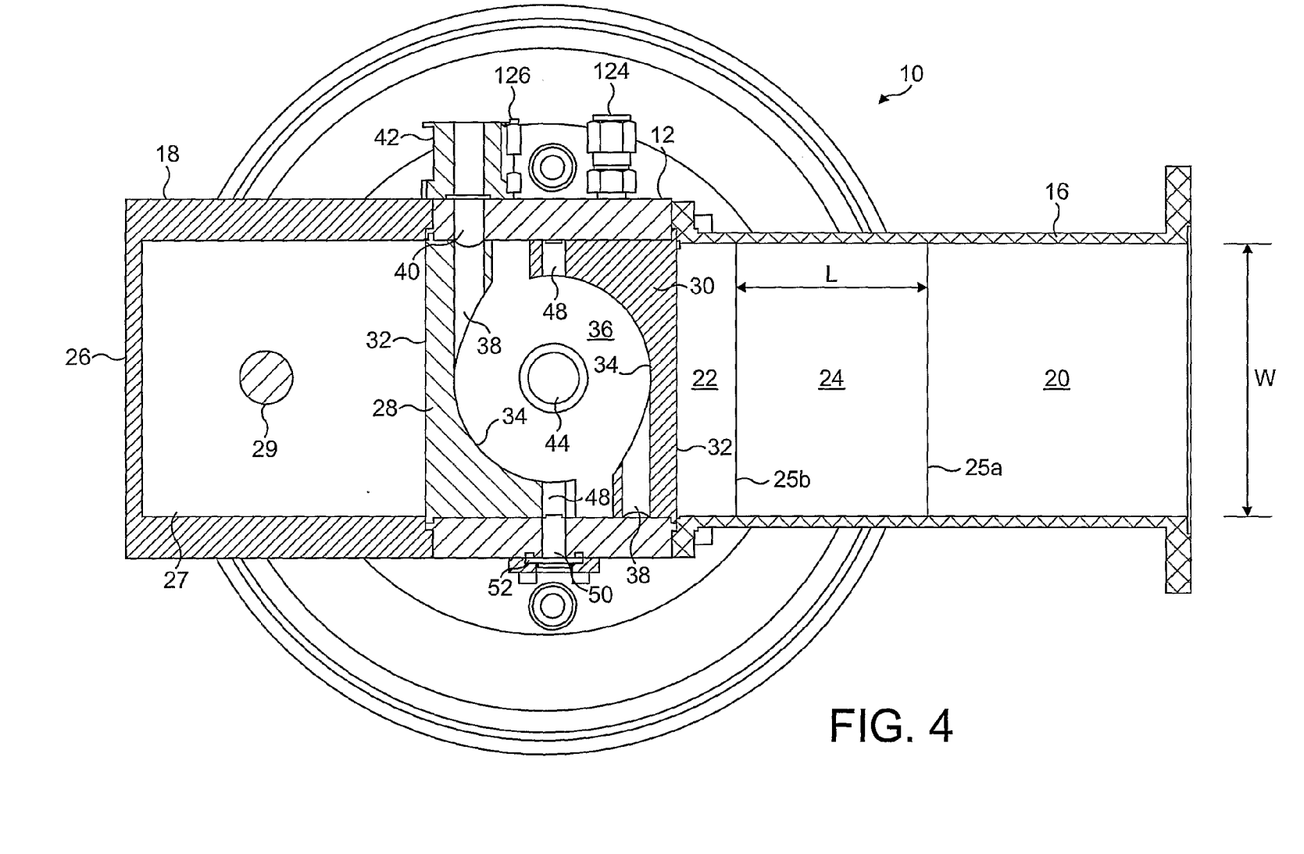
FIG. 4 is a cross-sectional view through the device along line B-B of FIG. 2.

The holder 60 is preferably formed from electrically conducting material, such as stainless steel. This may be of similar grade to the housing 12, or a different grade. The electrically conducting member 58 and holder 60 are preferably at electrical ground during use of the abatement device 10. The holder 60 has a hollow interior within which the tube 62 and tip 64 of the electrically conducting member 58 are preferably a sliding fit. The holder 60 comprises a first body portion 66 having an outwardly extending skirt 68, which is located on a flanged opening 70 of the bore 54 of the housing 12. An O-ring 72 is provided between the skirt 68 and the flanged opening 70 to form an air-tight seal, the skirt 68 being clamped to the flanged opening 70 by a clamp chain 74 extending thereabout. As illustrated in FIG. 3, the O-ring 72 is preferably located outside of the gas chamber and therefore outside of the electromagnetic field generated therein, and may extend about an annular ring 76 depending downwardly from the skirt 68, the annular ring having an inner diameter that is substantially equal to the diameter of the bore 54, and which makes electrical contact with the housing 12. Alternatively, the base of the skirt 68 may make electrical contact with the housing 12.

The holder 60 further comprises a second, elongate body portion 78 that extends into the bore 54. The second body portion 78 of the holder 60 terminates with a conical projection 80, which preferably does not protrude into the gas chamber 36. The internal diameter of the second body portion 78 decreases at the conical projection 80 to provide a shoulder 82 that engages a rim 84 of the tip 64 to retain the tip 64 within the holder 60. The second body portion 78 of the holder 60 is preferably integral with both the first body portion 66 and the skirt 68.

As illustrated in FIG. 5, the tip 64 preferably protrudes into the gas chamber 36. The length of the tip 64, and/or the length of the second body portion 78 of the holder 60, is preferably chosen so that the tip 64 extends a predetermined distance into the standing wave generated within the resonant cavity 14 depending on the frequency of the microwave radiation supplied to the resonant cavity 14.

The tube 62 is preferably held in electrical contact with the holder 60. As illustrated, a metal spring 86 or other electrically conducting item, may be located within the holder 60 such that one end of the spring 86 engages a first annular projection 88 formed on the tube 62 and the other end of the spring 86 engages a metallic lock nut 90 threaded into the holder 60.

The tube 62 has a second annular projection 92 spaced from the first annular projection 88 to define an annular channel 94 between the holder 60 and the tube 62. A flow of cooling water is supplied to the annular channel 94, the water being supplied to the annular channel 94 through a coolant inlet port 96 passing through the holder 60, and being exhausted from the annular channel 94 through a coolant outlet port 98 passing through the holder 60 and located substantially opposite the coolant inlet port 96.

Depending on the power of the electromagnetic radiation conveyed to the resonant cavity, the intensity of electric field created within the resonant cavity 14 may be insufficient to ignite a plasma within the gas chamber 36. Therefore, a glow-discharge electrode assembly 100 may be housed within the electrically conducting member 58. The electrode assembly 100 comprises a plasma-ignition, glow-discharge electrode 102, which is in the form of an elongate, high voltage electrode located concentrically within, but spaced from, the tube 62 of the electrically conducting member 58. A connector 104 connects the electrode 102 with a power supply. The electrode 102 may be threaded into a conformingly-threaded aperture located concentrically with the lock nut 90. A gas inlet 106 is formed within the tube 62 for receiving a flow of a glow-discharge gas, such as nitrogen, a noble gas, or any other substantially inert and ionisable gas, from a gas inlet port 108 extending radially through the first body portion 66 of the holder 60. The gas inlet port 108 receives the glow-discharge gas from a connector 110 attached to the holder for connecting the gas inlet port 108 to a source of the glow-discharge gas. The gas inlet 106 is preferably arranged tangentially with respect to the bore of the tube 62 of the electrically conducting member 58 to promote formation of a helical flow path around electrode 102 generally downwardly towards the tip 64 of the electrically conducting member 58.

Figure 1:
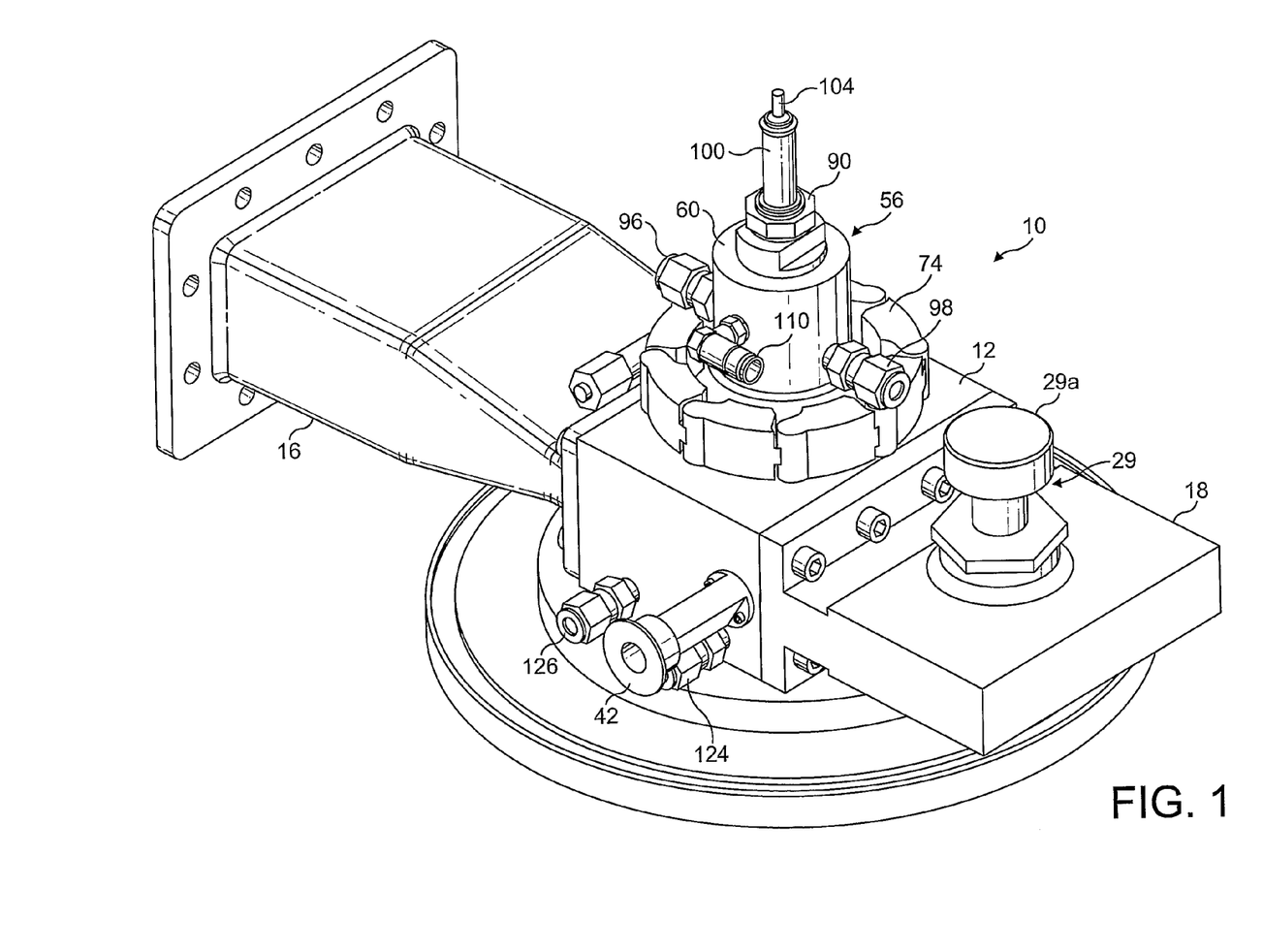
FIG. 1 is an external perspective view of a microwave plasma abatement device.
Figure 2:
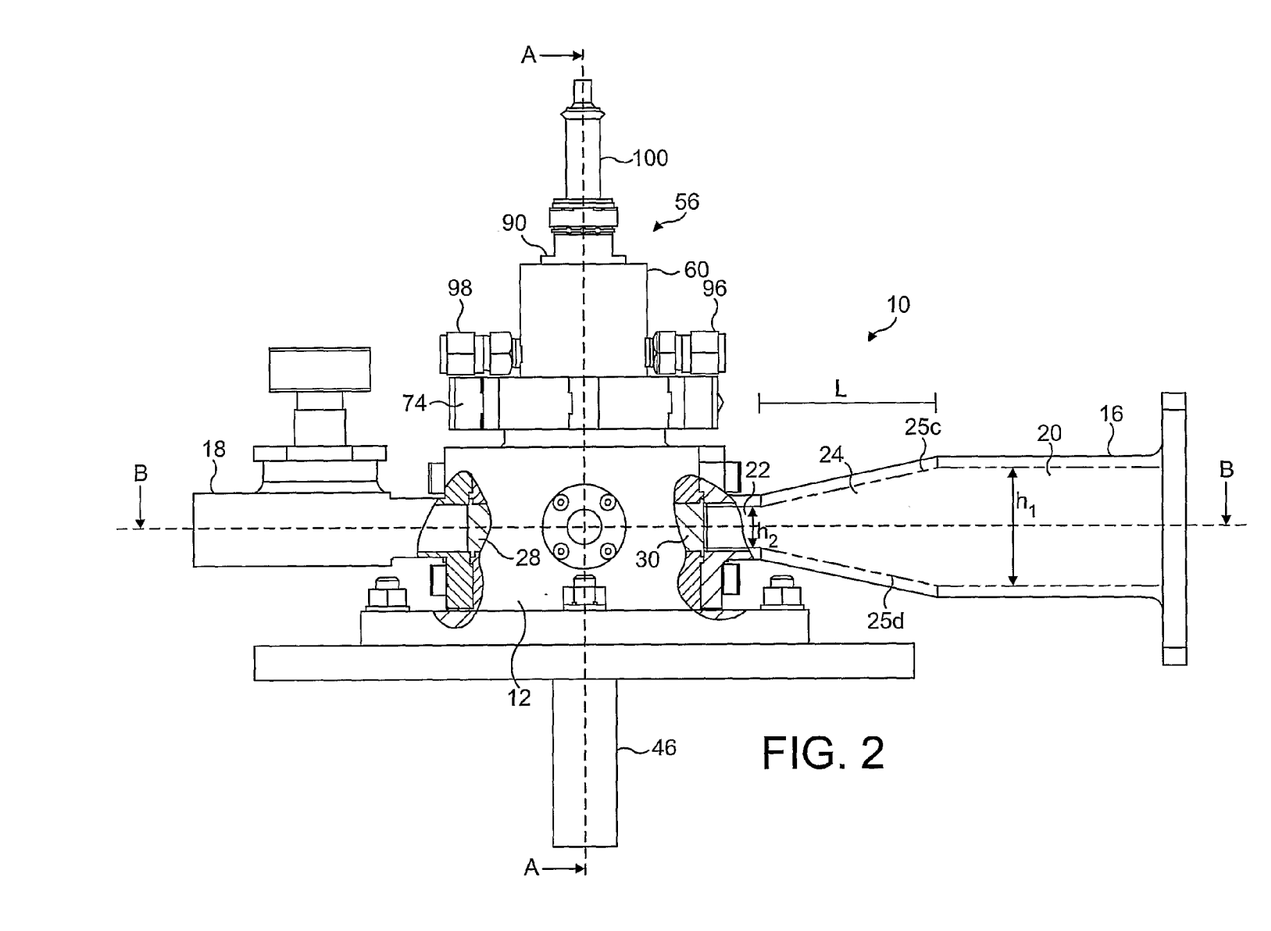
FIG. 2 is a side view of the device of FIG. 1.

As illustrated in FIG. 2, when the holder 60 is mounted on the housing 12, the electrically conducting member 58 extends into the bore 54 substantially perpendicular to the direction of propagation of the microwaves through the gas chamber 36, and is substantially co-axial with both the gas chamber 36 and the gas outlet port 44. The tip 64 of the electrically conducting member 58 is preferably located at a maximum intensity of the electromagnetic field formed within the resonant cavity 14 during use of the abatement device 10.

During normal use of the abatement device 10, a flow of cooling water is supplied to the annular channel 94. A gas is pumped into gas chamber 36 through the gas inlet port 40, flows spirally within the gas chamber 36 and passes beneath the tip 64 of the electrically conducting member 58 before leaving the gas chamber 36 through the gas outlet port 44 and entering the second gas conduit 46.

Microwave radiation is fed into the resonant cavity 14, and thus into the gas chamber 36, for a magnetron by the waveguide 16. The end plate 26 of the short circuit 18 reflects the microwaves to form a standing wave within the resonant cavity 14, with the tip 64 of the electrically conducting member 58 intensifying the electric field within the gas chamber 36. The tapered portion 24 of the waveguide 16 serves to inhibit the transmission and reflection of microwave radiation from the interface between the first and second body portions 20, 22 of the waveguide 16 whilst maximising the energy absorption of the plasma. The geometry and position of the lower surface 112 of the skirt 68 of the holder 60 relative to the tip 64 of the electrically conducting member 58 is chosen so that the lower surface 112 of the skirt 68 provides, with the inner surface of the bore 54 of the housing 12 and the outer surface of the second body portion of the holder 60, a co-axial tuner for matching the impedance in the plane of the electrically conducting member 58 to the impedance of the waveguide 16 at the frequency of the microwave radiation.

When a glows-discharge electrode assembly 100 is used to ignite a plasma within the gas chamber 36, the glow-discharge gas is caused to flow through the gas inlet port 106 of the tube 62 and into the bore of the tube 62. A low-voltage, high-current source is connected to the electrode 102, and a high voltage is applied temporarily to the electrode 102. The high voltage results in a corona discharge through the glow-discharge gas from the tip of the electrode 102 towards a proximal portion of the tube 62. That corona discharge provides a path through which a large current from the low voltage source can flow to ground. Flow of the large current causes formation of a glow discharge in the glow-discharge gas. The glow discharge thus formed is caused by the flow of the glow-discharge gas within the tube 62 to move from the tip 64 of the electrically conducting member 58 into the gas chamber 36. Microwave radiation within the gas chamber 36 is able to couple efficiently to the glow discharge and, in typically less than one second, the plasma ignites, leading to a stable microwave plasma which can be maintained by means of the microwave radiation supplied to the gas chamber 36 alone after the power supply to the electrode 102 is switched off (typically within two or three seconds).

The plasma initiated within the gas chamber 36 is carried out from the gas chamber 36 through the gas outlet port 44 with the gas flowing through the gas chamber 36, and is contained within the second gas conduit 46. The plasma thus resembles a flame generated beneath the tip 64 and extending out through the gas outlet port 44 into the second gas conduit 46. Due to the high temperature created within the second gas conduit 46 during use of the abatement device 10, a coolant such as water may be sprayed over the outer surface of the second gas conduit 46 to cool the second gas conduit 46.

The microwave plasma generated within the gas chamber 36 may be used for a number of purposes. One such purpose is for the treatment of a gas exhaust from a semiconductor process chamber. Depending on the nature of the processes taking place in the process chamber, varying amounts of harmful perfluorocompound gases such as $CF_4$, $C_2F_6$, $CHF_3$, $NF_3$ or $SF_6$, silane and ammonia may be present within the exhaust gas. These gases can be removed from the gas with high efficiency using the abatement device 10. Water vapour for reacting with these gases can be added to the exhaust gas upstream from the abatement device 10, for example by passing the exhaust gas through a wet pre-scrubber or by adding a stream of water vapour to the exhaust gas. Within the gas chamber 36, these gases react with the water vapour to form gases such as $CO_2$ and HF, which can be subsequently removed from the exhaust gas by a wet scrubber located downstream from the abatement device 10.

Problems can arise when the exhaust gas contains gases such as HBr, HCl, $Br_2$ and $Cl_2$. HBr and HCl present in the chamber 36, together with HF generated as a by-product of a reaction occurring within the gas chamber 36, can strip the passive surface oxide layers from the stainless steel surfaces of the housing 12 and nozzle holder 60, exposing the stainless steel. Water vapour present within the exhaust gas entering the gas chamber 36 can adsorb on to the exposed stainless steel surfaces, and promote corrosion of these surfaces by the reaction of HBr, HCl, $Br_2$ or $Cl_2$ with metallic constituents of the stainless steel. As well as degrading the surfaces of these stainless steel components, the by-products from the corrosion can interfere with the microwaves entering the resonant cavity 14, and this can lead to a reduction in the destruction and removal efficiency of the gas treatment taking place within the gas chamber 36.

In view of this, when the gas entering the gas chamber 36 is likely to contain a halocompound such as HBr, HCl, $Br_2$ or $Cl_2$, either simultaneously with water vapour or separately therefrom, prior to pumping the gas into gas chamber 36 through the gas inlet port 40, the gas chamber 36 is heated to a temperature that inhibits adsorption of water on the stainless steel surfaces within the gas chamber 36. This temperature is preferably in excess of 100° C., in this example around 120° C., to minimise the risk of any water adsorption on the stainless steel surfaces within the gas chamber 36.

The gas chamber 36 may be heated by igniting a plasma within the gas chamber 36 from the glow-discharge gas, and maintaining that plasma with the supply of microwave radiation for a period of time sufficient to raise the temperature of the gas chamber to around 120° C. before the gas enters the gas chamber 36 through the gas inlet 40. Alternatively, the housing 12 may be externally heated to raise the temperature of the gas chamber 36 above 120° C.

During use of the abatement device 10 to treat the gas entering the gas chamber 36 through gas inlet 40, it is then necessary to maintain the temperature of the gas chamber 36 at or above a temperature that inhibits the water adsorption. In view of this, in the preferred embodiment the abatement device 10 includes a chamber temperature control circuit for controlling the temperature of the gas chamber 36.

With reference to FIGS. 3 and 5, the housing 12 includes a fluid cavity 120 located adjacent the gas chamber 36. In this embodiment, the fluid cavity 120 extends about the gas outlet 44 from the gas chamber 36. A thermal fluid, such as pressurised steam, hot silicone oil or other diathermic fluid is being supplied to the fluid cavity 120 through a fluid inlet port 122 passing the housing 12 and which receives thermal fluid from a first external connector 124. The thermal fluid is exhausted from the fluid cavity 120 through fluid outlet port (not shown) also passing through the housing 12 and located adjacent the fluid inlet port 122. A second external connector 126 located adjacent the first external connector 124 receives the thermal fluid from the fluid outlet port.

Figure 6:
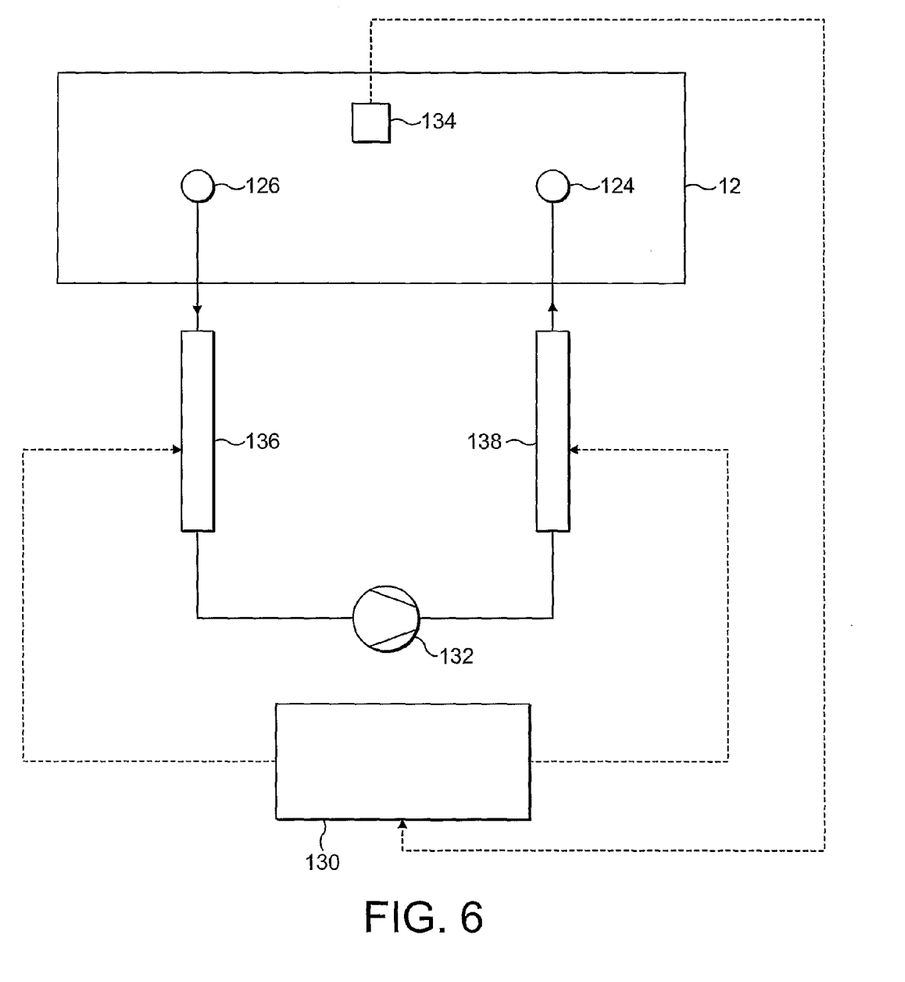
FIG. 6 illustrates a chamber temperature control circuit for controlling the temperature of the gas chamber of the device.

With reference to FIG. 6, the fluid cavity 120 forms part of the chamber temperature control circuit 130 for controlling the temperature of the gas chamber 36. A flow of thermal fluid is circulated within the circuit 130 by a pump 132. The flow of fluid enters the fluid cavity from connector 124, circulates about the cavity 120 before being exhaust from the cavity 120 through connector 126, thereby controlling the temperature of the adjacent gas chamber 36.

The temperature of the thermal fluid is controlled by a controller 130 which receives signals indicative of the temperature of the gas chamber 36 from a sensor 134 which, as illustrated in FIG. 6, may be mounted on the external surface of the housing 12 proximate the gas chamber 36 or at any other location suitable for detecting the temperature of the gas chamber 36. In response to those signals, the controller 130 controls one or more heat exchangers 136, 138 for controlling the temperature of the thermal fluid.

To avoid overheating, the gas chamber is preferably operated within a range of temperatures, preferably between 120 and 350° C. In this example, the gas chamber 36 is operated within the temperature range from 120 to 180° C.

When the signals output from the sensor 134 indicate that the temperature of the gas chamber 36 is towards the top end of this temperature range, due to the heat generated by the plasma within the gas chamber 36, the controller 130 operates a first heat exchanger 136 to cool the thermal fluid to a first temperature below this temperature range, for example around or less than 100° C., so that the thermal fluid serves to reduce the temperature of the gas chamber 136 as it passes through the fluid cavity 120. When the signals output from the sensor 134 indicate that the temperature of the chamber 36 is towards the bottom end of this temperature range, for example after a period of cooling by the relatively cold thermal fluid, the controller 130 operates a second heat exchanger 138 to heat the thermal fluid to a second temperature within or above this temperature range, for example around or above 120° C., so that the thermal fluid serves to raise the temperature of the gas chamber 36 as it passes through the fluid cavity 120. Optionally, the first heat exchanger 136 need not be operated during operation of the second heat exchanger, and vice versa, and so the circuit 120 may be configured to enable one, or both, of the heat exchangers to be selectively by-passed depending on the temperature of the gas chamber 36.

In this example, a direct, active method is used to control the temperature of the gas chamber. However an indirect method may be employed, as outlined below.

First, the nominal and maximum continuous operating temperatures for the gas chamber 36 may be decided, for example 120 to 130° C. Next, the maximum heat dissipation from the microwave power source (power losses and plasma losses) may be determined, by calculation, estimation or measurement. Knowing the specific heat capacity of the thermal fluid, the flow rate to limit the maximum temperature as previously determined may be derived. The first heat exchanger 136 may then be designed to dissipate a little more energy than that absorbed in the gas chamber 36 and the second heat exchanger 138 may then be employed to control the temperature of the circulating thermal fluid to the required temperature (120° C. in this example) so that the temperature control of the gas chamber 36 is indirect, that is, through temperature control of the circulating thermal fluid on the fluid inlet to the gas chamber 36.

In addition to being used to maintain the temperature of the gas chamber 36 within the selected temperature range, the circuit 120 may also be used to initially heat the gas chamber 36 before the gas to be treated enters the gas chamber 36.

By heating the gas chamber in this manner to prevent the adsorption of water on any stainless steel surface within the chamber, the reaction of corrosive hydrogen halides, such as HBr and HCl, $Br_2$ or $Cl_2$ with the metals contained in the stainless steel can be inhibited, as there is insufficient moisture present for the reaction to take place. We have found that maintaining the chamber at a temperature in excess of 120° C. can significantly increase the lifetime of any stainless steel components that are exposed to the gas passing through the gas chamber. This is different to simply heating the chamber above the dew point, as water adsorption at a stainless steel surface may still take place if the temperature of the chamber is not heated sufficiently above the dew point to inhibit water adsorption on the stainless steel surface.

In order to prevent overheating of the chamber, the chamber is preferably maintained at a temperature range between 120 and 350° C., more preferably between 120 and 180° C. The chamber may be conveniently maintained in this temperature range by flowing a heat transfer fluid through a chamber temperature control circuit for controlling the temperature of the chamber, and controlling the temperature of the fluid. The chamber temperature control circuit may be located in part within a wall of the chamber, for example either above, below or surrounding the gas chamber. In the preferred embodiment, the chamber temperature control circuit extends about the gas outlet.

The temperature of the fluid may be controlled by flowing the fluid through heat exchange means, and controlling the heat exchange means to control the temperature of the fluid. The heat transfer fluid may be selectively cooled to a first fluid temperature, preferably less than 120° C., by a first heat exchanger, and selectively heated to a second fluid temperature greater than the first fluid temperature, preferably at least 120° C., by a second heat exchanger. The first heat exchanger may be a passive device, such as a non-insulated pipe of the temperature control circuit, for dissipating heat from the thermal fluid, or it may be an active device controlled by a controller. The second heat exchanger is preferably an active device controlled by the controller. The circuit may be configured such that the heat transfer fluid flows through both heat exchangers, or through only a selected one of the heat exchangers, depending on the temperature of the gas chamber. This temperature may be monitored using a temperature sensor located on the wall of the gas chamber. The heat transfer fluid may be provided by hot oil, diathermic fluid or other thermal fluid.

The chamber may be initially heated to said temperature by the heat transfer fluid prior to supply of the gas to the chamber. Alternatively, the chamber may be heated by operating the abatement device, which generates a plasma to treat the gas stream and which will transfer heat to the gas chamber, using an external heating device, or in any other convenient manner.

In the preferred embodiment, the plasma abatement device comprises a microwave plasma abatement device, but the invention may also be applicable to other types of plasma abatement device, for example a plasma torch abatement device, which may have stainless steel electrodes and/or a stainless steel gas chamber. The gas is preferably treated at or around atmospheric pressure by the abatement device.

While the foregoing description and drawings represent the preferred embodiments of the present invention, it will be apparent to those skilled in the art that various changes and modifications may be made therein without departing from the true spirit and scope of the present invention.

We claim:

1. A method of treating a gas containing varying amounts of a halocompound and water vapour, the method comprising the steps of:
   providing a plasma abatement device comprising a gas chamber having a gas inlet for receiving the gas and a gas outlet;
   heating a housing of the chamber to a temperature that inhibits adsorption of water on a stainless steel surface within the chamber;
   conveying the gas to the gas chamber for treatment thereof within the chamber; and
   maintaining the housing of the chamber at or above said temperature during treatment of the gas,
   wherein the gas is treated at or around atmospheric pressure,
   wherein the housing of the chamber is maintained within the range from 120° C. to 180° C. during treatment of the gas.

2. The method according to claim 1 wherein the housing of the chamber is heated to at least 120° C. before the gas is conveyed to the chamber.

3. The method according to claim 1 wherein the housing of the chamber is maintained above said temperature by flowing a heat transfer fluid through a chamber temperature control circuit for controlling the temperature of the housing of the chamber, and controlling the temperature of the fluid.

4. The method according to claim 3 wherein the chamber temperature control circuit is located in part within a wall of the housing of the chamber.

5. The method according to claim 3 wherein the chamber temperature control circuit extends about the gas outlet.

6. The method according to claim 3 wherein the temperature of the fluid is controlled by flowing the fluid through heat exchange means, and controlling the heat exchange means to control the temperature of the fluid.

7. The method according to claim 6 wherein the heat transfer fluid is conveyed through at least one of a first heat exchanger to selectively cool the fluid to a first fluid temperature, and a second heat exchanger to selectively heat the fluid to a second fluid temperature greater than the first fluid temperature.

8. The method according to claim 7 wherein the first fluid temperature is lower than 120° C., and the second temperature is at least 120° C.

9. The method according to claim 3 wherein the heat transfer fluid comprises a diathermic fluid.

10. The method according to claim 3 wherein the housing of the chamber is heated to said temperature by the heat transfer fluid prior to supply of the gas to the chamber.

11. The method according to claim 1 wherein the plasma abatement device comprises a microwave plasma abatement device.

12. The method according to claim 1 wherein the halocompound comprises a hydrogen halide, $Br_2$ and $Cl_2$.

* * * * *

UNITED STATES PATENT AND TRADEMARK OFFICE
CERTIFICATE OF CORRECTION

PATENT NO.       : 8,518,162 B2
APPLICATION NO. : 11/990255
DATED            : August 27, 2013
INVENTOR(S)      : Smith et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1413 days.

Signed and Sealed this

Fifteenth Day of September, 2015

Michelle K. Lee
*Director of the United States Patent and Trademark Office*